United States Patent [19]

Alam

[11] Patent Number: 4,591,702
[45] Date of Patent: May 27, 1986

[54] DIGIT MANIPULATIVE DATA INPUT KEY

[76] Inventor: Naveed Alam, 2604 E. 5th Pl. (#9), Tulsa, Okla. 74104

[21] Appl. No.: 253,009

[22] Filed: Apr. 10, 1981

Related U.S. Application Data

[63] Continuation of Ser. No. 32,353, Apr. 23, 1979, abandoned.

[51] Int. Cl.⁴ .............................. G06 00/00; G07 00/00
[52] U.S. Cl. ..................................... 235/1 R; 200/1 R
[58] Field of Search .................... 340/365 S; 235/1 R; 200/6 A, 1 R; 179/90 FW

[56] References Cited

U.S. PATENT DOCUMENTS

| | | | |
|---|---|---|---|
| 2,327,782 | 8/1943 | Goff | 179/90 FW |
| 2,905,766 | 9/1959 | Soderbaum | 179/90 FW |
| 3,096,019 | 7/1963 | Frankel | 235/145 |
| 3,599,454 | 8/1971 | Hill | 235/449 |
| 3,678,250 | 7/1972 | Dethloff | 235/449 |
| 3,688,269 | 8/1972 | Miller | 340/825.33 |
| 3,750,113 | 7/1973 | Cencel | 340/365 S |
| 3,824,354 | 7/1974 | Anderson | 200/6 A |
| 3,842,248 | 10/1974 | Yarnell | 235/156 |
| 3,852,716 | 12/1974 | Horn | 340/365 S |
| 3,961,747 | 6/1976 | Small | 235/489 |
| 4,023,161 | 5/1977 | Sasaki | 340/365 R |
| 4,120,044 | 10/1978 | Harayda | 340/365 S |
| 4,176,782 | 12/1979 | Fukada | 235/449 |
| 4,224,602 | 9/1980 | Anderson | 340/365 S |

Primary Examiner—Harold I. Pitts
Attorney, Agent, or Firm—Weissenberger & Peterson

[57] ABSTRACT

In devices such as electronic calculators, which perform mathematical or like functions and require plurality of data inputs to perform their functions; a data input key is pivotally maintained within the body of said device and is adapted to provide a plurality of input data. The data input key has an upper exposed portion having an opening configured and adapted to be engaged by the thumb or finger of the user whereby the key may be manipulated to various contact positions situated in a circular or longitudinal path. These various contact positions provide different input data to the device. In another embodiment, a plurality of the input keys may be used to accommodate a large number of inputs, for example, the inputs of a typewriter.

6 Claims, 9 Drawing Figures

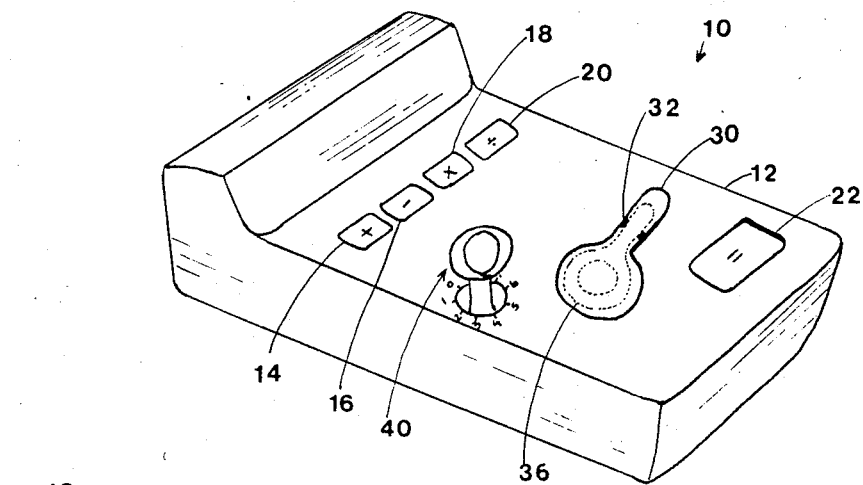
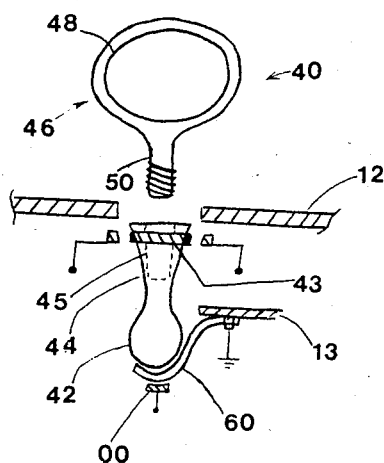
FIG 1
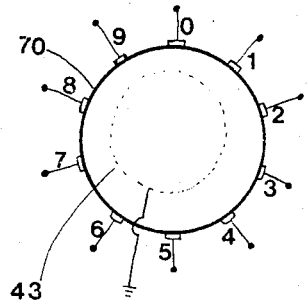
FIG 2
FIG 3
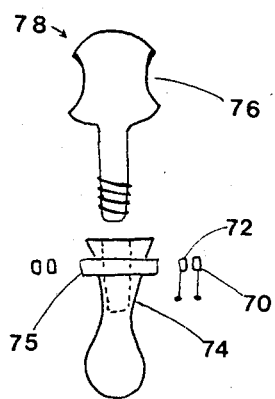
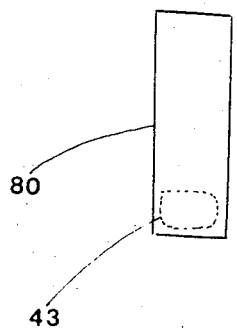
FIG 4
FIG 5

U.S. Patent May 27, 1986 Sheet 2 of 2 4,591,702
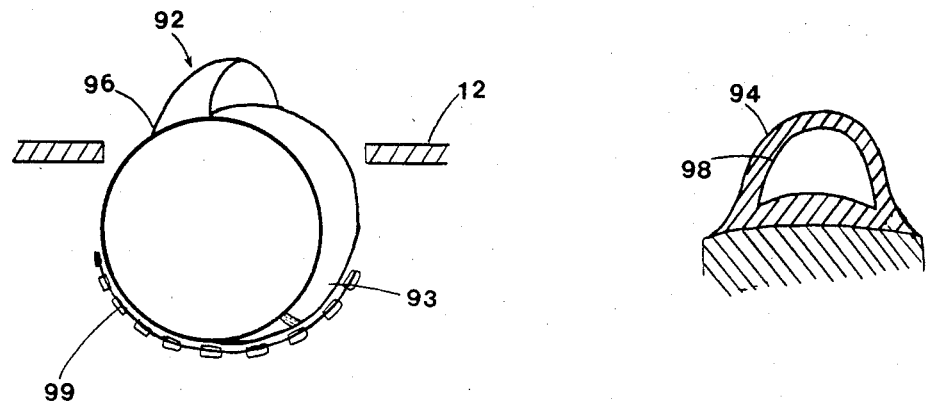
FIG 6
FIG 7
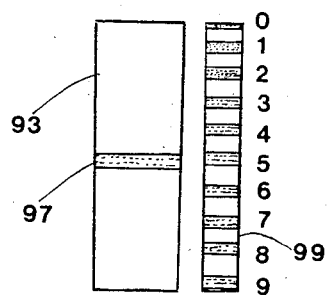
FIG 8
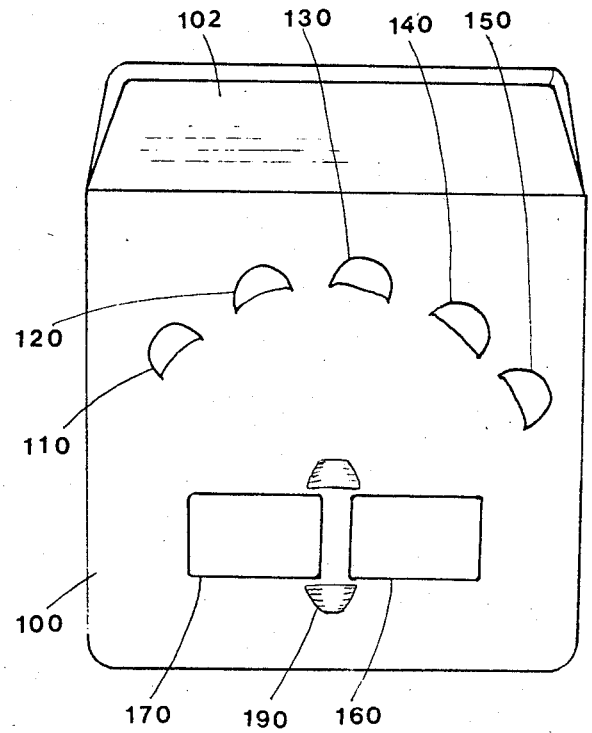
FIG 9

DIGIT MANIPULATIVE DATA INPUT KEY

This is a continuation of application Ser. No. 032,353 filed Apr. 23, 1979, now abandoned.

BACKGROUND OF THE INVENTION

This invention lies in the field of electronic and mechanical devices having a number of keys which perform the function of reading-in data for the device. More particularly the invention lies in the field of electronic calculators, especially the portable and hand-held type, and like devices wherein in the prior art a plurality of depressible keys are used to feed data to the electronic device.

Many electronic devices are on the market today which perform mathematical or algorithm functions. Such devices are usually provided with a plurality of keys which are depressed by the user to read in or stimulate a desired variable. Examples of this can be seen in hand-held calculators which may have as many as 30 different keys. Each of these keys is depressable and reads in one particular data into the calculator. Furthermore, since the hand-held calculators are small and portable, it is generally necessary that the keys be very small and minute. The problem with such small keys is that it requires a gread deal of concentration on part of the user to appropriately position his finger whilst depressing the desired key. This, of course, is distracting and requires the user to spend a good deal of time in proper selection of the keys, which time is necessarily a diversion from other functions that the mental process could be utilized for. Some manufactures of minute or mini-calculators, for example calculators which are of the size of a wrist watch, have provided a small toothpick-like rod by which the user depresses the appropriate key.

Besides the problem of the size of the keys, having plurality of keys, one for each variable requires the training of the users' fingers in an unproductive manner. For example, the common ten-key adding machine or calculator utilized in many offices requires that the user train at least three and usually four of his fingers which then become occupied in feeding figures 0 to 9 into the machine. However, a great deal of time is spent by the user to properly train his fingers, much like a typist has to practice typing for a long time before he or she can achieve mastery of using the typewriter. Furthermore, such ten-key adding machine or calculators generally have the keys positioned in close proximity of one other and as such, many times one finger may accidentally slip from one key onto another. To avoid such problems it is generally required that the ten-key calculator have large keys, which accordingly take up large space making the device bulky. Additionally, large keys add to the cost of the particular device.

It is well-known that human fingers can be trained so that they can use some of the devices on the market without really looking at the machines, as noted in the ten-key adding machine described above. This, of course, is impossible in a case of small hand-held calculators due to the spacing of the close keys and their relatively small, sometime minute, sizes.

SUMMARY OF THE INVENTION

The present invention provides means to overcome the forgoing disadvantages. It is an object of the invention to provide a key which may be secured or gripped by the user and manipulated to positions in a circular path or longitudinal path, such that various positions in the path provide various input data to the device. Another important object of the present invention is to provide a greatly reduced number of input keys.

The invention comprises, in one embodiment, a data input key pivotally secured within the body of the device, having an outer portion particularly configured to be secured by the thumb or one of the fingers of the user. The user may then change the position of the pivoted key to engage selected points in a a circular path and said selected positions on the circular path provide different input data to the device. Alternatively, the key may be moved in a longitudinal path, and selected position in such path would provide desired input data. The present invention suggests that part of the stem of the data input key may carry first contact means which when placed in contact with selected positions in the paths, which carry second contact means, electrical contact is made and variable input data is fed into the device.

The invention also contemplates that a plurality of the present data input keys may be used such that, where possible, the user may accomplish the entire manipulation normally and generally carried out by ten fingers (, for example, in a typewriter) by substantially reduced number of fingers.

Other and further advantages of this invention will be apparent on reference to the drawings and the detailed description herein.

DESCRIPTION OF THE DRAWINGS

FIG. 1 is a perspective view of a hand-held calculator with a data input key of the present invention;

FIG. 2 is an elevational perspective view of one embodiment of the data input key of the present invention;

FIG. 3 is an illustrative manner of operation of the present invention with input data positions arranged in a circular path;

FIG. 4 is an elevational view the data input key of the present invention with some variations in the manner of operation;

FIG. 5 is illustrative of the operation of the data input key of the present invention with the various input data contacts along a longitudinal path;

FIG. 6 is an elevational perspective view of another embodiment of the data input key of the present invention;

FIG. 7 is a sectional elevational view of the securing means of the data input key of FIG. 6.

FIG. 8 is a view of the lower surface of the data input key of FIG. 6, together with a view of arcuate path adjacent thereto;

FIG. 9 is a top view of a device (typewriter) using a plurality of data input keys of the present invention.

DESCRIPTION OF THE PREFERRED EMBODIMENT

In describing this invention, and by way of example, the manner of use has been related to devices requiring input of numerals 0 to 9. However, it should be noted that this illustration is not a limitation but only an illustrative use of the thumb/finger actuated data input key of the present invention.

Referring now to the drawings and particularily FIG. 1, reference character 10 generally indicates a calculator of the hand-held type. The calculator comprises a body 12, and by way of example it is assumed that the calculator is of the type performing multiplication, division, addition and subtraction, only. For such purposes 14 is the addition key, 16 is the subtraction key, 18 is the multiplication key, and 20 is the division key. Such calculators are provided with an "equal" or total key, which is represented by 22. To read in the numerals 0 to 9 in this calculator 10, the key of the data input present invention is shown situated within the body 12, and is represented by numeral 40. The data input key 40 is removable and during periods of non-use of the calculator 10, the input key is stored in a particularly configured cavity 30 wherein anchors 32 retain the key 40 in a secure position. The data input key is shown as being placed in cavity 30 in dashed-outline 38.

Looking now at FIG. 2, the data input key of the present invention can be seen in greater details. As shown, the key 40 comprises a bulbous lower end 42, a stem portion 44, and an upper securing means 46. The securing means 46 is illustrated in the form of a ring 38, of a particular size and configuration that the thumb or one finger of the user may be inserted therein. The securing means 36 has a lower threaded arm 50 which fits in the internally threaded cavity 45. Thus the securing means 46, when attached to stem 44, protrudes outwardly from the outer surface of the body 12 and represents the exposed portions of the key 40; as shown in FIG. 1.

To practice this invention it is required that the key be secured in a manner that it may be pivoted on a vertical axis. For such purposes FIG. 2 shows that the bulbus member 42 is supported on a floating spring 60 attached to some portion 13 of the device 10. It will be apparent that other means of attachment of the bulbus member are possible and the particular embodiment is shown only as an illustration.

The present invention contemplates more than one embodiment, but for purposes of clarity it is preferable that the embodiment just detailed be first described in its operative mechanism. For such purposes, a circular or circumferential path 70 has been chosen to position contact points 72 which would, when energized, read in the particular data they represent, for example numerals 0 to 9, into the calculator. For this illustration, it is shown that the stem portion 44 is provided with the negative contact whereas each of the contact points 72 illustrated in FIG. 3 are provided with the positive contact leading to the particular variable that each contact point designates. One manner of achieving this is shown in FIG. 2 wherein a portion 43 on the upper part of the stem 44 is made conductive and represents an electrical negative contact via, for example, the floating spring 60. It can be seen that since the key 40 is pivoted on its verticle axis, the conductive portion 43 may be placed in contact with any of the contact positions 72, representing data 0 to 9 in FIG. 3. For each contact position that the stem conductive portion 43 is in contact with, the desired numeral which that contact point represents would be fed into the calculator. The manner of achieving contact, and the position of the conductive part 43 on the key system of course, could be changed. For example, the contact points 0 to 9 in FIG. 3 could be arranged in multiple tiers, as could the key system contact portion 43.

Referring again for a moment to FIG. 2, it is preferred that the key 40, when depressed, should energize the decimal point, and cause it to be read as part of the input. For such purposes, the contact leading to the decimal point, represented by numeral 00, may be positioned below the floating spring 60 as illustrated.

Another manner of achieving electrical contact between the electrical negative and positive elements is shown in FIG. 4. Reference numbered 70 indicates the negative element and 72 is the positive element. The two elements are placed in close proximity. The stem 74 is provided with a collar 75 which, when positioned against a particular contact position, urges contact between elements 70 and 72. It should be noted also that the securing means 78 is a bulbous member having depressions 76 provided to make it easy to hold the securing means 78 between two fingers of the user. The purpose of showing this particular configuration of the securing means 78 is to illustrate that the shape of securing means may vary. All that is required is that the key 40 be gripped by the user and be variabily positionable.

For operation of the embodiment described above in FIGS. 1 and 2, the thumb of the user is secured in the ring-portion 48 (in FIG. 1) of the securing means 78 (in FIG. 4) is grasped by the user with two fingers, and the particular data is read into the calculator by various positions of the stem portion 44. Next, the mathematical step to be undertaken, represented by keys 14, 16, 18 and 20, is depressed by the users' fingers while the thumb remains in the ring 48. To obtain the total or the sum of the operation, the equal bar 22 is depressed by the palm of the user.

Referring now to FIG. 5, a longitudinal path is shown for the data input key 40 of this embodiment to move in. In this case, particular positions 81 in the longitudinal path 80 represent the input data, for example numerals 0 to 9. Reference 12 denotes the body of the calculator.

It will be apparent that the user may train his thumb and, remember the particular position of any desired numeral and thus may be able to read in the data without ever having to look at the calculator.

Another embodiment of this invention as illustrated in FIG. 6 wherein 12 indicates the body of the calculator and 90 generally indicates a substantially circular wheel rotatable about its center and having securing means 92 which is particularily configured such that a finger or thumb of the user may be retained therein. Thus the wheel 90 may be moved in an arcuate path and various positions in such arcuate path provide input of selected data into the device.

Looking now for a moment at FIG. 7, the securing means 92 is shown in greater detail. It preferably comprises a truncated dome-like figure 94 closed at one end 96 (or it may be open at the end 96) and having in the interior thereof ridges 98 provided to frictionally retain the finger of the user with ease. For such purposes the securing means 92 may be made of rubber or other material.

In this embodiment, to energize particular data, for example numerals 0 to 9, the negative element 97 is situated on the lower surface 93 of the wheel 90. The positive elements 99 are positioned dispersed in an arcuate path in close proximity to the lower surface 93. Various positions of the positive elements 99 in said arcuate path represent different numerals. This relationship of the negative element 97 and the positive elements is better shown in FIG. 8.

It can be seen that the user may place his thumb or one finger in the securing means 92 and move the wheel 90 causing contact to be achieved between elements 97 and selected one of elements 99.

It will be apparent that for devices like the hand-held calculators, the data input key described in this invention may be substituted for the depressable keys.

For devices requiring a greater number of input data, for example a typewriter, more than one data input key of the present invention may be utilized. For example, referring to FIG. 9, five keys of the embodiment illustrated in FIG. 6 are shown disposed in spaced relation, each key adapted to reading particular alphabetic or alphanumeric characters.

The device illustrated and represented by 100 may be a typewriter with a visual display 102 (which can be the printer of a typewriter). The display 102 may be remotely situated, if desired. The data input key 110 may be used to read in characters a to f, key 120 for characters f to l, key 130 for characters m to r, key 140 for characters s to x and key 150 for characters y and z. For ease of operation, depressable key 160 may be provided such that when depressed, the alphabetic characters are fed in as capital letters, and depressable key 170 may be used to change from alphabetic to numerals or other desired alphanumeric character, distributed in particularly selected manner among the various keys 110 to 150. The object of this configuration is to enable the user to carry out the entire function of typewriting with only one hand, thus leaving the other hand free. Additionally, supports 190 provide means to rest the palm of the user.

The advantages of the device 100 will be obvious. The user may easily train his or her fingers and palm and be able to achieve the function of typewriting at much faster rate than possible with the use of two hands. It should be noted that it may be desirable to distribute the alphabet in a particular manner. For example, it may be useful placing the repeatedly occuring characters, such as the vowels, on key 110 because the thumb is stronger, and placing characters such as q or z on key 150 since the "little finger" is generally the weakest. For those desiring to practice this invention, studies may be undertaken to determine which alphabet letters should be placed on which particular data input key. Of course, in some operations the user may use both hands or all ten fingers where the device is determined to need as many data input keys. The data input key of the present invention provides a greatly increased number of input data possible, and further, there is ease of operation since no strain on the user resulting from depressing operation, for example with typewriters, occurs. There is greater strain on the fingers with a banging or up and down action than with the data input keys of the present invention which provide a securing means to support the finger and make operation easy.

It should be noted also that the data input keys 110 to 150 may be of the type illustrated in FIG. 2.

While this invention has been described with a particular degree of particularity, it is manifest that many changes may be made in the detail of construction and the arrangement of components without departing from the spirit and scope of this disclosure. It should be understood that the invention is not limited to the embodiments set forth herein for purposes or explanation and illustrations, but is to be limited only by the scope of the attached claims, including the full range of equivalency to which each element thereof is entitled.

What is claimed is:

1. In devices requiring input of data by a user to perform desired functions, a data input key comprising;
   a lower portion pivotally maintained within said device;
   an upper ring portion removably attached to the lower portion and extending exteriors of said device for digital manipulation;
   said upper portion comprising a single opening for insertion of a finger or thumb of the user therein;
   the data key adapted to be moved in a designated path whereby particularly situated positions in said designated path, when engaged by said input key, providing particular input data to the device.

2. In devices requiring manual input of data by a user to perform desired functions and having contact points representing different inputs:
   a pivoted lower portion;
   an upper portion coupled to said lower portion and extending exterior of said device for digital manipulation, said upper portion comprising an opening for insertion of a digit of the user therein to engage said data input key thereby;
   the data input key adapted to be digitally manipulated to activate said contact points representing particular input.

3. The device as in claim 1 or 2 wherein said upper portion comprises a ring member, one finger of the user being insertable in said ring member.

4. The device as in claim 1 or 2 wherein at least one input data is stimulated by depression of the input key.

5. In devices requiring input of data by a user to perform desired functions, wherein said desired functions include mathematical, algorithm and composition features, at least one data input key comprising;
   a body portion pivoted about its center and adapted to be moved in an arcuate path about said center having a lower surface and an upper surface; the upper portion provided with securing means whereby at least one finger of the user is held in contact with the body portion; said lower surface provided with at least one contact point; the body portion adapted to be moved by said finger in a designated path whereby particular situated positions, adjacent said lower surface, when engaged by said contact point provide particular data input to the device.

6. The device as in claim 5 wherein said securing means comprises an elastomeric band adapted to fit snugly over at least one digit of the user.

* * * * *